(12) United States Patent
Brandenburg et al.

(10) Patent No.: US 9,131,630 B2
(45) Date of Patent: Sep. 8, 2015

(54) EDGE SEAL FOR ELECTRONICS ASSEMBLY SUITABLE FOR EXPOSURE TO ELECTRICALLY CONDUCTIVE COOLANT

(71) Applicant: DELPHI TECHNOLOGIES, INC., Troy, MI (US)

(72) Inventors: Scott D. Brandenburg, Kokomo, IN (US); Richard D. Parker, Tipton, IN (US); Khalid M. Eltom, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 271 days.

(21) Appl. No.: 13/917,921

(22) Filed: Jun. 14, 2013

(65) Prior Publication Data

US 2013/0279113 A1    Oct. 24, 2013

Related U.S. Application Data

(63) Continuation-in-part of application No. 13/432,475, filed on Mar. 28, 2012, now Pat. No. 8,699,225.

(51) Int. Cl.
*H05K 7/20*    (2006.01)

(52) U.S. Cl.
CPC .................................. *H05K 7/20927* (2013.01)

(58) Field of Classification Search
CPC . H01L 23/49506; H01L 23/473; H02M 7/06; G06F 2200/201; G06F 1/20
USPC ............ 361/679.53, 698, 699, 714, 715, 716; 165/80.4, 80.5, 104.13; 257/714; 62/259.2

See application file for complete search history.

(56) References Cited

U.S. PATENT DOCUMENTS

| | | | |
|---|---|---|---|
| 6,812,553 B2 | 11/2004 | Gerbsch et al. | |
| 7,095,098 B2 | 8/2006 | Gerbsch et al. | |
| 7,508,668 B2* | 3/2009 | Harada et al. | 361/699 |
| 7,724,523 B2* | 5/2010 | Ishiyama | 361/699 |
| 7,911,792 B2* | 3/2011 | Liang et al. | 361/699 |
| 8,094,454 B2* | 1/2012 | Lowry | 361/699 |
| 2006/0232942 A1* | 10/2006 | Nakatsu et al. | 361/710 |
| 2007/0076355 A1* | 4/2007 | Oohama | 361/676 |
| 2007/0096278 A1* | 5/2007 | Nakatsu et al. | 257/678 |
| 2009/0231810 A1 | 9/2009 | Liang et al. | |
| 2013/0087307 A1* | 4/2013 | Brandenburg et al. | 165/51 |
| 2014/0158324 A1* | 6/2014 | Tochiyama et al. | 165/67 |

FOREIGN PATENT DOCUMENTS

| | | |
|---|---|---|
| EP | 2 325 880 A2 | 5/2011 |
| EP | 2 582 217 A2 | 4/2013 |
| EP | 2 645 839 A2 | 10/2013 |

OTHER PUBLICATIONS

European Search Report dated Feb. 25, 2015.

\* cited by examiner

*Primary Examiner* — Anthony Haughton
*Assistant Examiner* — Matt Dhillon
(74) *Attorney, Agent, or Firm* — Lawrence D. Obgetts

(57) ABSTRACT

A liquid cooled power electronics assembly configured to use electrically conductive coolant to cool power electronic devices that uses dielectric plates sealed with a metal sleeve around the perimeter of the dielectric plates to form a device assembly. The configuration allows for more direct contact between the electronic device and the coolant, while protecting the electronic device from contact with potentially electrically conductive coolant. Material used to form the dielectric plates and the housing are selected to have similar coefficients of thermal expansion (CTE) so that the reliability of the seals is maximized.

6 Claims, 2 Drawing Sheets

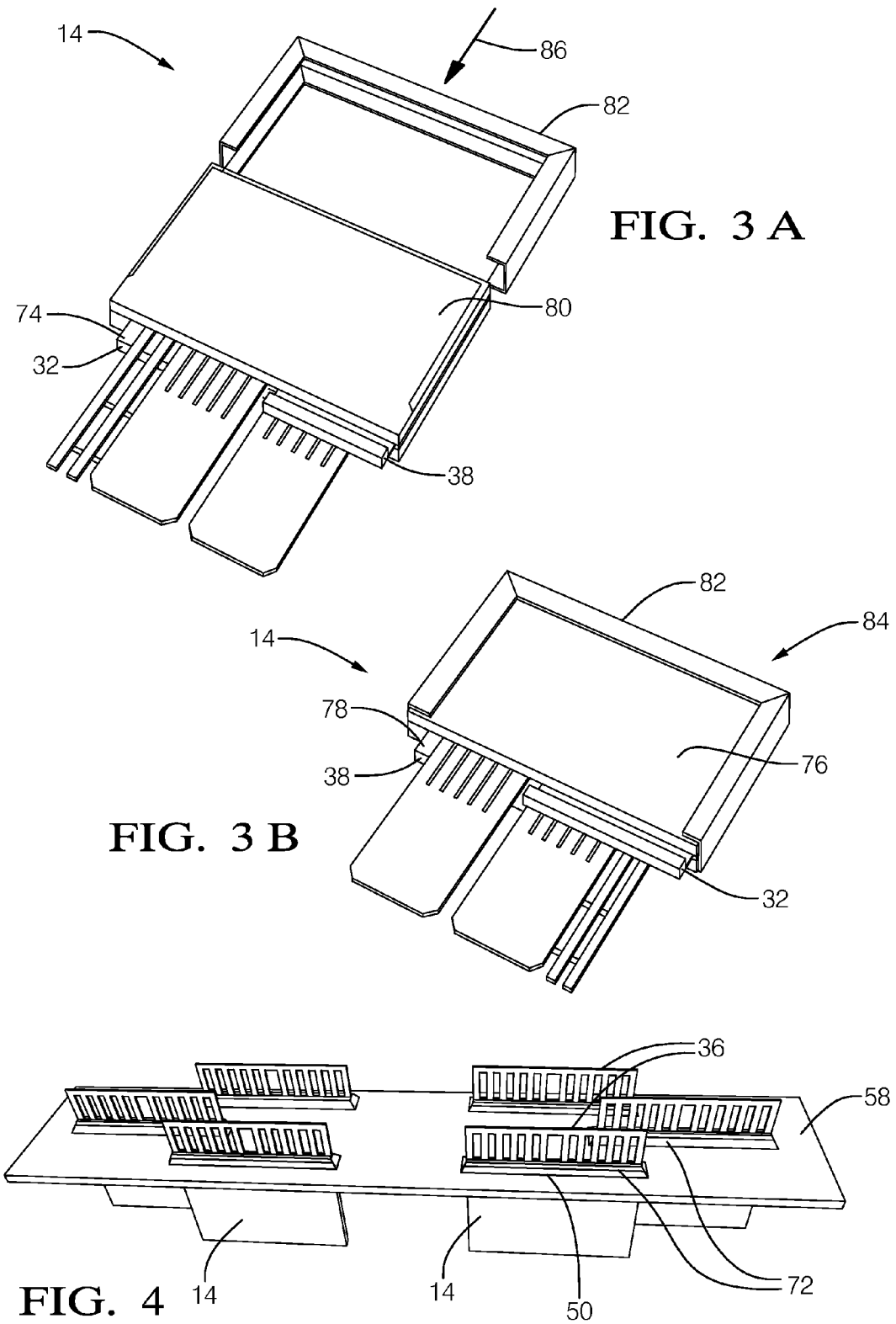

EDGE SEAL FOR ELECTRONICS ASSEMBLY SUITABLE FOR EXPOSURE TO ELECTRICALLY CONDUCTIVE COOLANT

CROSS-REFERENCE TO RELATED APPLICATION

This application is a continuation-in-part application and claims the benefit of U.S. patent application Ser. No. 13/432,475, entitled LIQUID COOLED ELECTRONICS ASSEMBLY SUITABLE TO USE ELECTRICALLY CONDUCTIVE COOLANT, and filed on Mar. 28, 2012, the entire disclosure of which is hereby incorporated herein by reference.

TECHNICAL FIELD OF INVENTION

This disclosure generally relates to a liquid cooled power electronics assembly, and more particularly relates to an assembly that uses a wrap-around metal sleeve to protect the electronic device from contamination or operational interference by electrically conductive coolant such as automotive engine coolant.

BACKGROUND OF INVENTION

It is a continuing desire to increase power dissipation ratings of electronics, and put those electronics into smaller packages. One industry where this is especially true is the transportation industry, especially in view of the advent of electric or hybrid automobiles. Such automobiles are propelled, all or in-part, by electric motors that rely on transistors and other devices to switch electrical power to the electric motors. The power controlled by these transistors may have voltage potentials ranging from 100 Volts to 2400 Volts, and may switch currants range from 50 Amperes to 600 Amperes. Any increase in the efficiency by which heat is removed from transistors can increase the reliability or power rating of the electronics.

SUMMARY OF THE INVENTION

In accordance with one embodiment, a liquid cooled power electronics assembly is provided. The assembly is configured to tolerate the use of electrically conductive coolant to cool power electronic devices. The assembly includes a housing, an electronic device, a lead frame, a first dielectric plate, a second dielectric plate, and a sleeve. The housing is configured to define an inlet, an outlet, and a cavity configured to contain coolant within the cavity between the inlet and the outlet. The electronic device is located within the cavity. The electronic device is characterized as being substantially planar in shape and so defines a first planar side, a second planar side opposite the first planar side, and a device perimeter between the first planar side and the second planar side. The lead frame is electrically coupled to the electronic device and extends outside the cavity through an opening in the housing. The first dielectric plate defines a first inner surface that is attached to the first planar side and a first outer surface opposite the first inner surface. The first outer surface is metalized, and the first dielectric plate has a first plate perimeter that extends beyond at least a portion of the device perimeter. The second dielectric plate defines a second inner surface attached to the second planar side and a second outer surface opposite the first inner surface. The second outer surface is metalized, and the second dielectric plate has a second plate perimeter that extends beyond at least a corresponding portion of the device perimeter. The sleeve is formed of metallic foil and configured to wrap around a portion of the first plate perimeter and a corresponding portion of the second plate perimeter. The sleeve is further configured to be attached to the first outer surface and the second outer surface in a manner effective to form a seal and thereby isolate the electronic device from the coolant. The first dielectric plate, the second dielectric plate, and the sleeve cooperate to form a device package.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 3A is a perspective view of a partially assembled device package used in the assembly of FIG. 1 in accordance with one embodiment;

FIG. 3B is a perspective view of a partially assembled device package used in the assembly of FIG. 1 in accordance with one embodiment; and FIG. 4 is a perspective view of part of the assembly of FIG. 1 in accordance with one embodiment.

DETAILED DESCRIPTION

Figure 1:
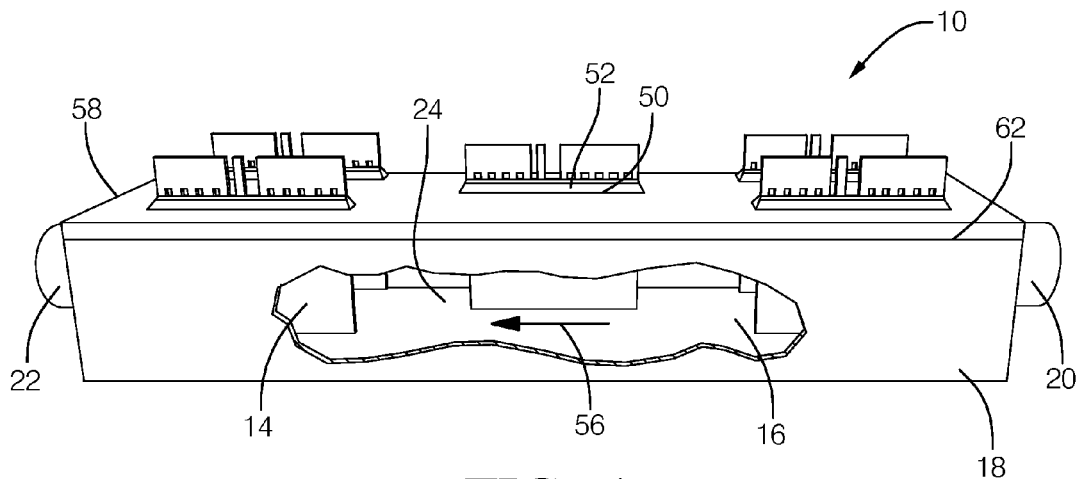
FIG. 1 is a cutaway perspective view of a liquid cooled power electronics assembly in accordance with one embodiment.

FIG. 1 illustrates a non-limiting example of a liquid cooled power electronics assembly, hereafter the assembly 10. In general, the assembly 10 described herein is a sealed electronics assembly that immersion cools a power dissipating electronic device 12 (FIG. 2) that is inside a device package 14 with coolant 16, such as a mixture that includes water and ethylene glycol. It should be appreciated that such water-based coolant may be electrically conductive, and so the assembly 10 described herein must sufficiently isolate the electronic device 12 from the coolant 16 in order to prevent electrical shorting or unexpected operation of the electronic device 12. It should also be appreciated that it is not a requirement that the coolant 16 be electrically conductive, and so a non-electrically-conductive coolant would be suitable if it has adequate heat transfer characteristics.

The assembly 10 generally includes a housing 18. The housing 18 may be formed of polymeric material such as a glass gilled nylon marketed as Zytel™ by Dupont (part number 70G25HSLR BK099), or may be formed of metal such as aluminum. The housing 18 may include an inlet 20 and an outlet 22 configured to make a fluidic sealed connection to, for example, hoses (not shown) providing a fluidic connection to a heat exchanger (not show) that transfers heat from the coolant to, for example, ambient air. In general, the inlet 20 receives relatively lower temperature coolant for the assembly 10, and the outlet 22 removes coolant warmed by power dissipated by the electronic device 12. The housing 18 also generally defines a cavity 24 inside the housing 18 that contains the coolant 16 as it passes from the inlet 20 to the outlet 22. The size and shape of the cavity 24, the inlet 20, and the outlet 22 are determined based on the number and size of the device package 14, the amount of power dissipated by the device package 14, and expected coolant inlet temperatures using know engineering rules and design practices.

Figure 2A:
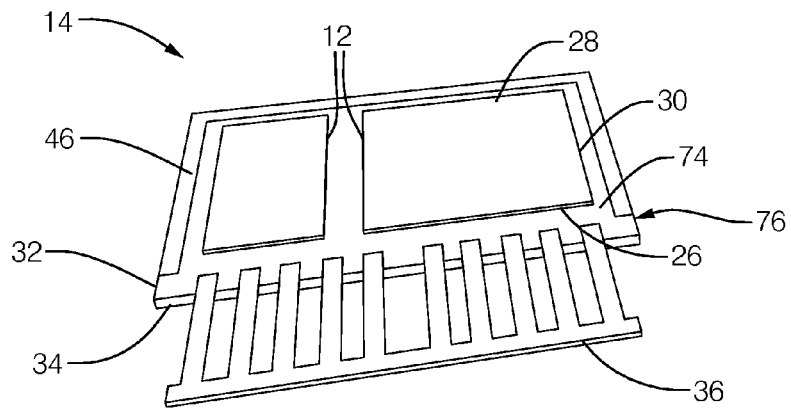
FIG. 2A is a perspective view of a partially assembled device package used in the assembly of FIG. 1 in accordance with one embodiment.
Figure 2B:
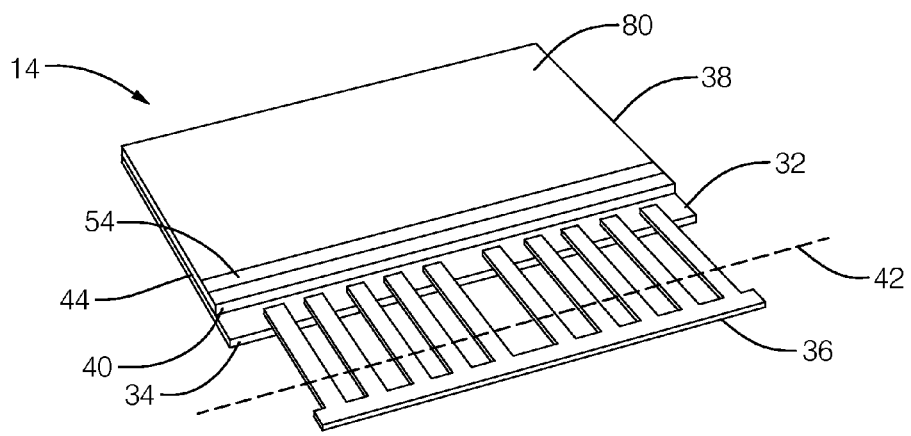
FIG. 2B is a perspective view of a partially assembled device package used in the assembly of FIG. 1 in accordance with one embodiment.

FIGS. 2A and 2B illustrate a device package 14 that is partially assembled. The electronic device 12 is typically a wafer level device, meaning that the electronic device 12 is generally described as unpackaged, typically with exposed surfaces of silicon, passivation, or thin film metallization. The electronic device 12 may be a solid state electronic switch such as a transistor, for example, a metal oxide semi-conductor field effect transistor (MOSFET), or insulated gate bipolar transistor (IGBT), or a diode. By way of example and not limitation, a typical electronic device is formed predominately of silicon having dimensions of 12 millimeters (mm) by 12 mm by 0.075 mm. The electronic device 12 may be generally characterized as being substantially planar in shape, and so generally defines a first planar side 26 (not specifically shown), and a second planar side 28 opposite the first planar side 26. The planar shape of the electronic device 12 may also generally define a device perimeter 30, or edge, between the first planar side 26 and the second planar side 28.

The device package 14 may also include a first dielectric plate 32 attached to the first planar side 26. The first dielectric plate 32 generally defines a first plate perimeter 34 that extends beyond at least a portion of the device perimeter 30. The first dielectric plate 32 is preferably a ceramic material, for example aluminum nitride, aluminum oxide, or silicon dioxide. Ceramic material is preferred because the coefficient of thermal expansion (CTE) typically more closely matches that of the electronic device 12, and so is believed to generally improve the reliability of the attachment of the first dielectric plate 32 to the electronic device 12. As the outer surface of the device package 14 will be exposed to the coolant 16, ceramic based materials are also an excellent choice as they are generally impervious to fluids that may be used as the coolant 16. By way of example and not limitation and for the typical electronic device suggested above, suitable dimensions for the first dielectric plate 32 are 28 mm by 20 mm by 2 mm. If the first dielectric plate 32 is too thin, then it may be too delicate to reliably handle and process as described herein. If the first dielectric plate 32 is too thick, then it may undesirably increase thermal resistance between the electronic device 12 and the coolant 16.

The device package 14 may also include a lead frame 36 electrically coupled to the electronic device 12 and extending beyond the first plate perimeter 34. The lead frame may be formed of copper or a copper alloy, and may be fabricated by folding, coining, and/or shearing as will be known by those in the art. The lead frame 36 may advantageously formed of a metal that has a CTE that closely matches the material selected for the first dielectric plate 32. Closely matched CTE's are desirable for the same reasons of improved reliability given above. The lead frame 36 illustrated has several leads or fingers coupled together by a joining section for the purpose of simplifying the assembly of the lead frame 36 to the first dielectric plate 32. It will be recognized by those in the art that all or part of the joining section may be cut off along the dashed line 42 after the device package 14 is assembled so that individual connections to the several legs are not electrical shorted together.

The device package 14 may also include a second dielectric plate 38 attached to the second planar side 28. The second dielectric plate 38 generally defines a second plate perimeter 40 that extends beyond at least a corresponding portion of the device perimeter 30 that corresponds to at least a portion of where the first plate perimeter 34 extends beyond the device perimeter 30. The attachment of the first dielectric plate 32 and the second dielectric plate 38 to the electronic device 12 may be by way of soldering, sintering, or conductive adhesive as will be recognized by those in the art. FIG. 2B does not show the second dielectric plate 38 overlaying the lead frame 36 only for the purpose of simplifying the illustration. It is recognized that the second dielectric plate 38 may be extended to overlay all or part of the lead frame 36 for the purpose of making an electrical connection between the lead frame 36 and the second planer side 28 of the electronic device 12. Preferably, the second dielectric plate has the same thickness as the first dielectric plate 32 so that stresses on the electronic device 12 are substantially balanced after the device package 14 is assembled.

Further details regarding the assembling of the electronic device 12, the first dielectric plate 32, the second dielectric plate 38, and the lead frame 36 may be found in U.S. Pat. No. 6,812,553 issued to Gerbsch et al. on Nov. 2, 2004, and U.S. Pat. No. 7,095,098 issued to Gerbsch et al. on Aug. 22, 2006. The entire contents of both patents are hereby incorporated herein by reference. It is noted that the electronic package described in these patents would not be suitable for immersion cooling because of the gap between the dielectric plates that would allow coolant to contact the electronic device therebetween. The benefit of having the first plate perimeter 34 and the second plate perimeter 40 extend correspondingly beyond the device perimeter 30 will become apparent as sealing of the device package 14 to protect the electronic device 12 from the coolant 16 is described below.

To avoid the problem of coolant contacting the electronic device 12, the device package 14 may optionally include a first metallic seal 44 formed between a portion of the first plate perimeter 34 that extends beyond the device perimeter 30, and a corresponding portion of the second plate perimeter 40. In general, the first metallic seal 44 isolates the electronic device 12 from the coolant 16. Preferably, the first metallic seal 44 formed by one of silver sintering or soldering. A sintered seal is formed using heat and pressure and is thought to be stronger and more reliable than a soldered seal. However, a soldered seal joint can be formed without the added complexity of applying pressure to the device package 14, but a soldered seal may be less reliable because of intermetallic alloys between the solder and base metal on the dielectric plates, for example, see metalized region 46 and metallization layer 54 described below. Sintering may also be preferable because it would not be affected if the device package was subjected to a subsequent soldering operation, for example when the device package is installed into the housing 18. As such, the first dielectric plate 32, the second dielectric plate 38, and the first metallic seal 44 cooperate to form the device package 14.

FIG. 2A illustrates a non-limiting example of a metalized region 46 that defines the location of the first metallic seal 44. A suitable width of the metalized region 46 is 3 mm. The metalized region 46 may include a layer of thick-film ink printed and fired onto the first dielectric plate 32. Alternatively the metalized region 46 may be built upon a foundation of thin film metal deposited onto the first dielectric plate 32. If the electronic device 12 is thin enough, for example less than 0.12 mm, then the metalized region 46 may be made sufficiently thick on the first dielectric plate 32, and a corresponding metalized region (not shown) may be established on the second dielectric plate 38 so that the first metallic seal 44 can be formed. In one embodiment, the metalized region 46 may have a plating thickness about equal to or slightly greater than (e.g. 1 mil) half of a device thickness of the device so that when the metalized regions are joined, the electronic device 12 is closely coupled to the first dielectric plate 32 and the second dielectric plate 38.

It is recognized that other types of seals between the first dielectric plate 32 and the second dielectric plate 38 are possible, for example dipping the assembly of the first dielectric plate 32, second dielectric plate 38 and electronic device 12 into a polymeric coating material, or spraying a similar material. However, it is believed that such non-metallic seals would not provide sufficiently reliable seals in view of the typical negative forty (−40) to positive one hundred twenty five (+150) degree Celsius (° C.) operating temperatures for automotive applications. Furthermore, any additional coating over the exposed surfaces of the first dielectric plate 32 and/or the second dielectric plate 38 would likely reduce heat transfer from dielectric plates to the coolant 16. Applying a polymeric or epoxy material into the gap 60 between the first dielectric plate 32 and the second dielectric plate 38 is also considered undesirable as it is considered to be less reliable than a metallic type seal.

FIGS. 3A and 3B further illustrate the assembling of the device package 14. The first dielectric plate 32 defines a first inner surface 74 that is attached to the first planar side 26 of the electronic device 12. The first dielectric plate 32 also defines a first outer surface 76 opposite the first inner surface 74. Preferably, the first outer surface 76 is metalized as environmental testing has revealed that some ceramic materials can be attacked by long term exposure to water and ethylene glycol (WEG) coolant resulting in dielectric breakdown. Similarly, the second dielectric plate 38 defines a second inner surface 78 attached to the second planar side 28 of the electronic device 12. The second dielectric plate 38 also defines a second outer surface 80 opposite the second inner surface 78. Likewise, the second outer surface 80 is preferably metalized.

As an improvement over and edge seal (e.g. the first metallic seal 44) the device package 14 may include a sleeve 82 formed of metallic foil and configured to wrap around a portion of the first plate perimeter 34 and a corresponding portion of the second plate perimeter 40. In general, the sleeve 82 is configured to be attached to the first outer surface 76 and the second outer surface 80 in a manner effective to form a seal 84 around the edges of the device package exposed to the coolant 16, and thereby isolate the electronic device 12 from the coolant 16. The sleeve 82 may be pre-formed as shown in FIG. 3A and installed by sliding the pre-formed part in the direction shown by arrow 86. Alternatively, the sleeve 82 may be formed in place onto the electronic device 14 using the edges of the first dielectric plate 32 and the second dielectric plate 38 as breaks for forming the sleeve 82.

The sleeve 82, the first outer surface 76, and the second outer surface 80 are preferably formed of copper or copper alloy so that the sleeve 82 may be soldered or sintered to the first outer surface 76 and the second outer surface 80. As such, the first dielectric plate 32, the second dielectric plate 38, and the sleeve 82 cooperate to form the device package 14. The sleeve 80 may be used alone instead of the first metallic seal 44 to protect the electronic device 12, or may be used in addition to the first metallic seal 44. Using the sleeve 80 is particularly advantageous as it protects exposed ceramic edges of the first dielectric plate 32 and the second dielectric plate 38.

Referring again to FIG. 1, the housing 18 generally defines an opening 50 through which the device package 14 may be inserted and secured in place by forming a second metallic seal 52 between the device package 14 and the opening 50.

The second metallic seal 52 is preferably formed by soldering, as opposed to using only a polymeric material. Soldering is preferred in order to reliably prevent the coolant 16 from passing out of the cavity 24 through the opening 50, as described above with regard to the first metallic seal 44. The second metallic seal 52 may include a metallization layer 54 (FIG. 2B, FIG. 4) applied to the first dielectric plate 32 and the second dielectric plate 38. Like the metalized region 46, the metallization layer 54 may be a direct bond metal layer such as copper directly bonded to the dielectric plate, or may be another form of patterned metal suitable for cooperating with other materials to form the second metallic seal 52. In one embodiment, the metallization layer 54 may extend around the edges of the first dielectric plate 32 and the second dielectric plate 38 so that the second metallic seal 52 goes all the way around the device package 14, including extending over the first metallic seal 44.

With this arrangement, an electronic device 12 may be located within the cavity 24 in order to make intimate contact with the coolant 16, and the lead frame 36 is used to electrically coupled to the electronic device and extend outside the cavity 24 through the opening 50 in the housing 18 so that an electrical connection to the lead frame 36 can be readily made. Preferably, the device package 14 is oriented to protrude into the coolant such that the plane of the device package 14 or electronic device 12 is substantially parallel to a flow direction 56 of the coolant 16 from the inlet 20 to the outlet 22. By making the device package 14 substantially parallel to the flow direction 56, it is believed that the electronic device 12 is cooled more uniformly than other orientations.

Continuing to refer to FIG. 1, it may be preferable to form most of the housing 18 of one material, a polymeric compound for example, but form the portion of the housing 18 that includes the opening 50 of a solderable material so the second metallic seal 52 is readily formed. As such, the assembly 10 or housing 18 may include a carrier plate 58 that defines the opening 50, and is coupled to the housing 18 in a manner effective to form a fluidic seal 62 between the carrier plate 58 and the housing 18. The fluidic seal 62 may include a sealant such as silicone adhesive, or an ethylene propylene diene monomer (EPDM) gasket. The carrier plate 58 may be secured to the housing 18 by the sealant, or may be secured using fasteners such as screws. Alternatively, if the materials used to form the carrier plate 58 and the housing 18 are compatible, the carrier plate 58 may be attached to the housing 18 using the known process of friction stir welding.

FIG. 4 illustrates a non-limiting example of a carrier plate 58 having several of the device package 14 installed and preferably secured to the carrier plate 58 by the second metallic seal 52 (not specifically shown). The carrier plate 58 is preferably formed of a material having a CTE similar to that of the device package 14 for the same reasons give above with regard to the first metallic seal 44. By way of example and not limitation, the carrier plate 58 may be formed of nickel iron alloy #42.

FIG. 4 further illustrates an optional feature of a sealant 72 applied to encapsulate the lead frame 36 proximate to where the lead frame 36 protrudes from the device package and proximate to the opening 50. The sealant 72 may be a room temperature vulcanization (RTV) type material, or it may be a curing epoxy type. Applying the sealing 72 is believed to help protect the lead frame 36 for vibration induced failures, and provide another barrier against coolant leaking.

Accordingly, a liquid cooled power electronics assembly 10 is provided. The assembly 10 makes use of seals (44, 52, 84) to provide robust seals suitable for automotive application that prevent the coolant 16 from leaking out of the housing 18, and/or contacting the electronic device 12 within the device package 14. The assembly 10 is particularly advantageous because it minimized the thermal path between the heat generating electronic device 12 and the coolant 16 when compared to other arrangements. Testing has demonstrated that the assembly 10 described herein has a power dissipating rating of 0.11 degrees Celsius per Watt (0.11° C./W), while an in-production assembly market by Delphi Inc. of Troy, Mich. under the moniker Viper has a less desirable rating of 0.15° C./W. While well suited for the automotive industry, the teachings set forth herein are applicable to other industries.

While this invention has been described in terms of the preferred embodiments thereof, it is not intended to be so limited, but rather only to the extent set forth in the claims that follow.

We claim:

1. A liquid cooled power electronics assembly configured to use electrically conductive coolant to cool power electronic devices, said assembly comprising:
    a housing configured to define an inlet, an outlet, and a cavity configured to contain coolant within the cavity between the inlet and the outlet;
    an electronic device located within the cavity, wherein said electronic device is characterized as being substantially planar in shape and thereby defines a first planar side, a second planar side opposite the first planar side, and a device perimeter between the first planar side and the second planar side;
    a lead frame electrically coupled to the electronic device and extending outside the cavity through an opening in the housing;
    a first dielectric plate that defines a first inner surface attached to the first planar side and a first outer surface opposite the first inner surface, wherein the first outer surface is metalized, said first dielectric plate having a first plate perimeter that extends beyond at least a portion of the device perimeter;
    a second dielectric plate that defines a second inner surface attached to the second planar side and a second outer surface opposite the first inner surface, wherein the second outer surface is metalized, said second dielectric plate having a second plate perimeter that extends beyond at least a corresponding portion of the device perimeter; and
    a sleeve formed of metallic foil and configured to wrap around a portion of the first plate perimeter and a corresponding portion of the second plate perimeter, said sleeve further configured to be attached to the first outer surface and the second outer surface in a manner effective to form a seal and thereby isolate the electronic device from the coolant, wherein the first dielectric plate, the second dielectric plate, and the sleeve cooperate to form a device package.

2. The assembly in accordance with claim 1, wherein the electronic device includes a solid state electronic switch.

3. The assembly in accordance with claim 1, wherein the first dielectric plate and the second dielectric plate are formed of aluminum nitride.

4. The assembly in accordance with claim 1, wherein the seal is formed by one of silver sintering and soldering.

5. The assembly in accordance with claim 1, wherein the device package is oriented to protrude into the coolant such that the plane of the device package is substantially parallel to a flow direction of the coolant.

6. The assembly in accordance with claim 1, wherein the opening is defined by a carrier plate coupled to the housing in a manner effective to form a fluidic seal between the carrier plate and the housing.

* * * * *